United States Patent
Erhardt et al.

(12) 
(10) Patent No.: US 6,399,467 B1
(45) Date of Patent: Jun. 4, 2002

(54) METHOD OF SALICIDE FORMATION

(75) Inventors: Jeff Erhardt, San Jose; Eric Paton, Morgan Hill, both of CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/733,779

(22) Filed: Dec. 8, 2000

(51) Int. Cl.[7] .................... H01L 21/3205; H01L 21/44
(52) U.S. Cl. .................... 438/592; 438/655; 438/664; 438/683
(58) Field of Search ................... 438/592, 655, 438/664, 683; 257/384, 413

(56) References Cited

U.S. PATENT DOCUMENTS

| | | | |
|---|---|---|---|
| 4,587,718 A | * 5/1986 | Haken et al. | 438/683 |
| 4,877,755 A | * 10/1989 | Rodder | 438/655 |
| 5,322,809 A | * 6/1994 | Moslehi | 438/592 |
| 5,891,785 A | * 4/1999 | Chang | 438/305 |
| 5,908,314 A | 6/1999 | Lin et al. | 438/301 |
| 6,136,705 A | * 10/2000 | Blair | 438/682 |
| 6,171,959 B1 | 1/2001 | Nagabushnam | 438/683 |
| 6,238,986 B1 | 5/2001 | Kepler et al. | 438/301 |
| 6,255,215 B1 | 7/2001 | Hause et al. | 438/682 |
| 6,268,257 B1 | 7/2001 | Wieczorek et al. | 438/305 |
| 6,306,698 B1 | 10/2001 | Wieczorek et al. | 438/197 |

OTHER PUBLICATIONS

New Effect of Ti–Capping Lyer in Co Salicide Porcess Promising for Deep Sub–quarter Micron Technology, Ja–Hum Ku, et al., IEEE IITC, 1999, pp. 256–258.

The Influence of Capping Layer Type on Cobalt Salicide Formation in Films and Narrow Lines, P.R. Besser, A. Lauwers, N. Roelandts, K. Maex, W. Blum, R. Alvis, Stucchi, M. De Potter, Advanced Interconnect Process Development, Advanced Micro Devices, Sunnyvale, CA; IMEC; Submitted to 1998 Spring MRS Symp. Proc.: Advanced Interconnects and Contact Materials and Processes for Future ICs, 6 pages.

\* cited by examiner

*Primary Examiner*—T. N. Quach
(74) *Attorney, Agent, or Firm*—Skjerven Morrill LLP; Alex C. Chen

(57) ABSTRACT

A method of forming a self-aligned silicide (salicide) with a screening oxide. The method improves transistor speed by lowering the leakage current in the source and drain areas and lowering the polysilicon sheet resistance of the gate. As a result of one embodiment of the present method, a silicide is formed over the gate area which is advantageously about two to three times thicker than silicide formations over the source and drain areas.

16 Claims, 2 Drawing Sheets

METHOD OF SALICIDE FORMATION

BACKGROUND OF THE INVENTION

1. Field of the Invention

This present invention relates to a method of forming a salicide. In particular, the present invention relates to a method of forming a salicide with a screening oxide.

2. Description of Related Art

A conventional transistor comprises a source area, a drain area and a gate area between the source and drain areas.

SUMMARY

The present invention relates to a method of forming a self-aligned silicide (salicide) with a screening oxide. The method improves transistor speed by lowering the leakage current in the source and drain areas and lowering the polysilicon sheet resistance of the gate. As a result of one embodiment of the present method, a silicide is formed over the gate area which is advantageously about two to three times thicker than silicide formations over the source and drain areas. The silicide formations formed over the source and drain areas are advantageously shallow, such that the silicide formations do not impede the junction and cause current leakage.

One aspect of the invention relates to a method of forming a silicide. The method comprises forming a metal layer over a gate area, a first oxide layer and a second oxide layer. The first oxide layer covers a source area and the second oxide layer covers a drain area. The method further comprises forming a capping layer over the metal layer. The capping layer comprises a material that can reduce an oxide. The method further comprises applying a first thermal anneal that causes the metal layer to at least partially react with the gate area to form a first silicide layer over the gate area. The method further comprises applying a second thermal anneal, wherein the second thermal anneal causes (1) the metal layer to further react with the gate area, (2) the material of the capping layer to diffuse through the metal layer and reduce the first and second oxide layers, and (3) the metal layer to at least partially react with the source and drain areas to form second and third suicide layers. The method further comprises removing the unreacted metal layer.

Another aspect of the invention relates to a product made by the method above.

The present invention will be more fully understood upon consideration of the detailed description below, taken together with the accompanying drawings.

DETAILED DESCRIPTION

Figure 1:
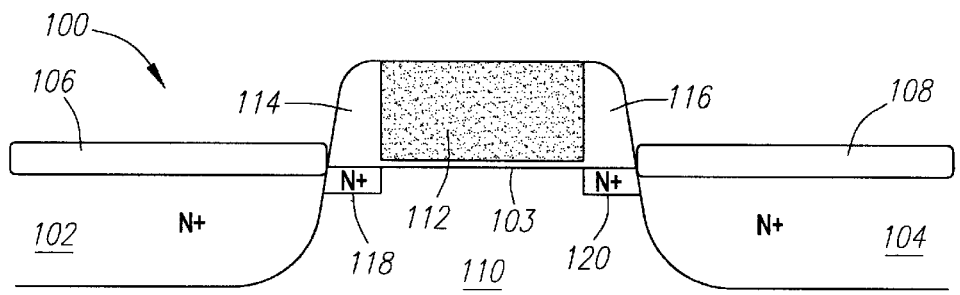
FIG. 1 illustrates one embodiment of a device at a first phase of development.

FIG. 1 illustrates one embodiment of a device 100 at a first phase of development. The device 100 includes a substrate 110, a source area 102, a drain area 104, a gate oxide layer 103, a first residual (screening) oxide layer 106 above the source area 102, a second residual oxide layer 108 above the drain area 104, a gate area 112, a first spacer 114, a second spacer 116, a first lightly-doped area 118 and a second lightly-doped area 120. In one embodiment, the residual oxide is about 20 to about 2000 Angstroms thick.

In one embodiment, the gate area 112 comprises a polysilicon, and the spacers 114, 116 comprise a nitride or oxide. In one embodiment, the substrate 110 is doped with P-type dopants, while the source area 102, drain area 104 and first and second lightly-doped areas 118, 120 are doped with N-type dopants. One of ordinary skill in the art will appreciate that the substrate 110 may be doped with N-type dopants, while the source area 102, drain area 104 and first and second lightly-doped areas 118, 120 are doped with P-type dopants.

In one embodiment, the device 100 of FIG. 1 is formed by forming a gate oxide layer 103 on the substrate 110 and depositing a polysilicon layer on top of the gate oxide layer 103. A diffusion barrier or hard mask layer (not shown) is then formed on top of the polysilicon layer. The gate area 112 is etched, and spacers 114, 116 are deposited and etched. The spacer etch is carried out with a high etch selectivity of the spacer material to the hard mask layer covering the gate area 112. The spacer etch stops on the silicon over the source and drain areas 102, 104 and the hard mask layer on the gate. Screening oxide layers 106, 108 about 20–2000 Angstroms thick are formed on the source and drain areas 102, 104 by wet chemical, thermal or vapor deposition, or other suitable process. The etch stop layer is selectively stripped away, leaving the screen oxide layers 106, 108 over the source and drain areas 102, 104 undisturbed.

Figure 2:
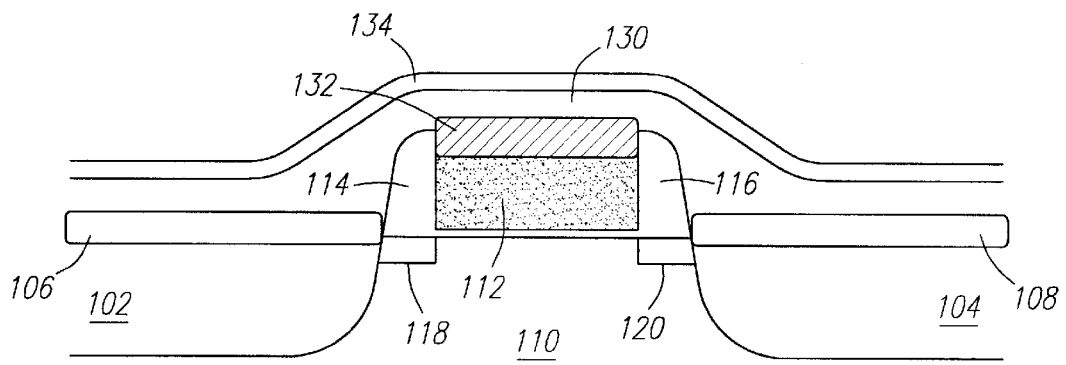
FIG. 2 illustrates the device of FIG. 1 at a second phase of development.

FIG. 2 illustrates the device 100 of FIG. 1 at a second phase of development. In FIG. 2, a metal layer 130 is deposited on the device 100 by using a deposition process such as, for example, physical vapor deposition (PVD), chemical vapor deposition or some other suitable process. The metal layer 130 may comprise a rare earth or transition metal in Groups 3B–8B and Groups 1B and 2B. For example, the metal layer 130 may comprise Co, Ti, W, Ni and/or Mo. Next, a capping layer 134 is formed on top of the metal layer 130. The capping layer 134 may comprise a material such as Ti, Al, Li, Mg and/or Ca. These elemental metals typically have good gettering ability, a large thermodynamic drive for oxidation and reactivity with impurities. For example, titanium-capped cobalt films have the ability to reduce an oxide, such as the oxide layers 106, 108, intentionally deposited under a cobalt layer (i.e., metal layer 130).

After depositing the metal layer 130, a low temperature thermal anneal (also called a reactive thermal anneal) causes the metal layer 130 and/or the capping layer 134 to react with the gate area 112 (called a dual reaction or silicide reaction). The anneal may be carried out using a traditional furnace, rapid thermal anneal (RTA) or laser. The low temperature thermal anneal may range in temperature, for example, from about 300 degrees C. to about 600 degrees C.

The silicide reaction over the gate area 112 forms a silicide layer 132, as shown in FIG. 2. The anneal temperature is preferably selected to be below a temperature that causes the material of the capping layer 134, such as titanium, to diffuse through the metal layer 130 and reduce the residual oxides 106, 108 over the source and drain areas 102, 104. The residual oxide layers 106, 108 mediate, slow down or prevent a silicide reaction, i.e., the metal layer 130 reacting with the source and drain areas 102, 104.

In one embodiment, the silicide reaction over the gate area 112 is driven to partial completion, e.g., about 50% to 95%, preferably 75% of the metal layer 130 is consumed by reacting with the gate area 112, while the metal layer 130 over the other active areas (i.e., source and drain areas 102, 104) remains substantially unreacted. In one embodiment, the thickness of the oxide layers 106, 108 is selected such that (1) a silicide formation over the source and drain areas 106, 108 is mediated or prevented during a first thermal anneal, and (2) a second thermal anneal causes a silicide formation over the source and drain areas 106, 108, as described below with reference to FIG. 3.

Figure 3:
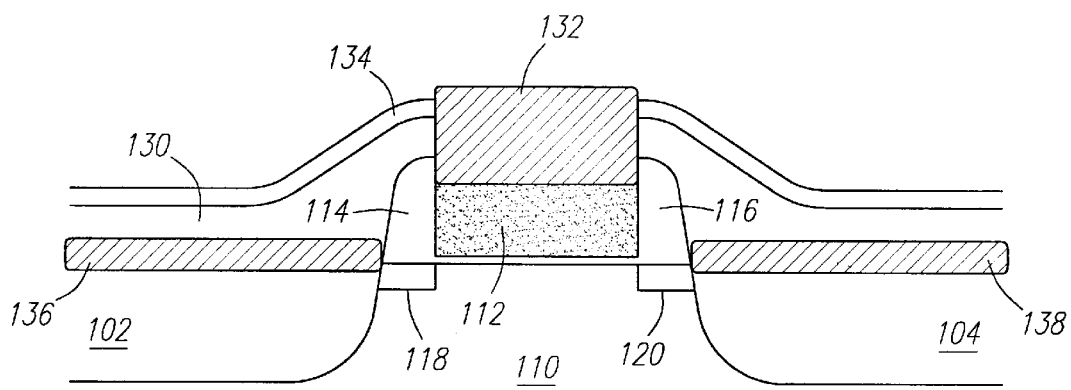
FIG. 3 illustrates the device of FIG. 1 at a third phase of development.

FIG. 3 illustrates the device 100 of FIG. 1 at a third phase of development. After the first RTA, a second higher temperature anneal is performed. The second higher temperature anneal may range in temperature, for example, from about 600 degrees C. to about 1000 degrees C. This second anneal advantageously (1) causes the material of the capping layer 134, such as titanium, to diffuse through the metal layer 130 and reduce the screening oxides 106, 108 (FIG. 2) over the source and drain areas 102, 104; (2) causes the metal layer 130 to at least partially react with the source and drain areas 102, 104 to form silicide layers 136, 138; and (3) drives the silicide formation 132 over the gate area 112 to completion (e.g., substantially all of the metal layer 130 is consumed by reacting with the gate area 112). In FIGS. 2 and 3, the desired thicknesses of the silicide layers 132, 136, 138 may be controlled by controlling the thickness of the deposited metal layer 130 and/or the temperature of the thermal anneals.

Figure 4:
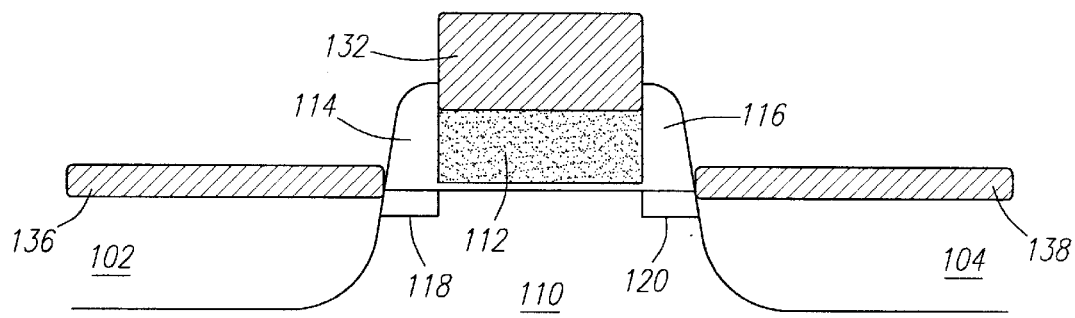
FIG. 4 illustrates the device of FIG. 1 at a fourth phase of development.

FIG. 4 illustrates the device 100 of FIG. 1 at a fourth phase of development. In FIG. 4, the unreacted metal layer 130 (FIG. 3) is selectively etched or stripped away. Processes that may be used to strip the unreacted metal layer 130 includes ammonium peroxide, hydrogen peroxide, sulphuric acid, etc. The resulting silicide formation 132 is advantageously thicker than the silicide layers 136, 138 formed over the source and drain areas 102, 104. In one embodiment, the resulting silicide formation 132 is about 2 to 3 times thicker than the silicide layers 136, 138 formed over the source and drain areas 102, 104.

Figure 5:
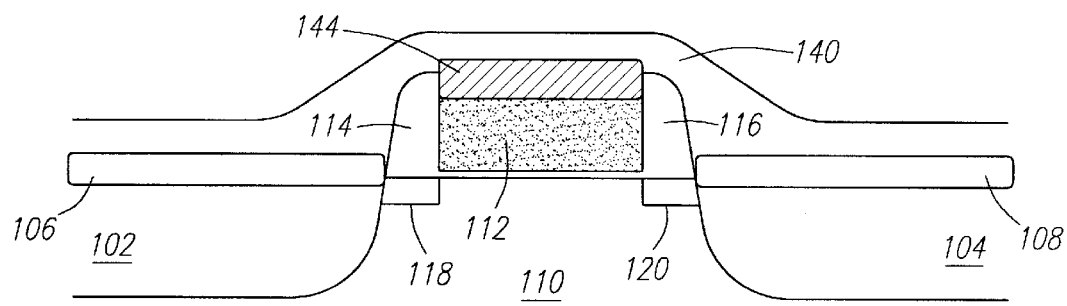
FIG. 5 illustrates the device of FIG. 1 at an alternative second phase of development.

FIG. 5 illustrates the device 100 of FIG. 1 at an alternative second phase of development. In FIG. 5, a transition metal layer 140, such as cobalt, is deposited without a capping layer, such as Ti. After the deposition, a low temperature thermal anneal, e.g., in the range of about 300 degrees C. to about 600 degrees C., is used to drive a silicide reaction and form a silicide layer 132 over the gate area 112. Similar to the phase shown in FIG. 2, the residual oxides 106, 108 protect the source and drain areas 102, 104 respectively from a silicide reaction. The silicide reaction over the gate area 112 is driven to partial completion (from about 50% to 95%, preferably 75%), while the metal layer 130 over the active source and drain areas 102, 104 remains substantially unreacted.

Figure 6:
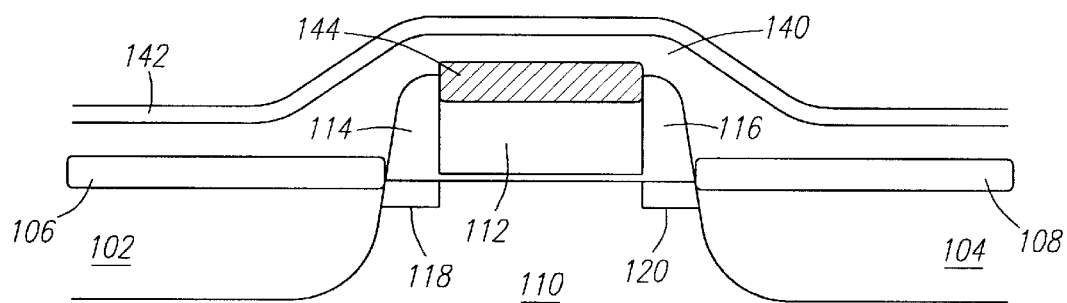
FIG. 6 illustrates the device of FIG. 1 at an alternative third phase of development.

FIG. 6 illustrates the device 100 of FIG. 1 at an alternative third phase of development. In FIG. 6, a capping layer 142, such as titanium, is deposited over the metal layer 140, such as cobalt. The capping layer 142 is preferably delayed until after the gate silicidation, to insure that (1) the material of the capping layer 142, such as titanium, does not reduce the oxide layers 106, 108 and (2) the metal layer 140 over the source and drain areas 102, 104 remains substantially unreacted. When a Ti cap is not used, the oxide underlayers 106, 108 prevent a silicide formation above the source and drain areas 102, 104. When a Ti cap 142 is used, the oxide underlayers 106, 108 are reduced, allowing a silicide reaction.

Figure 7:
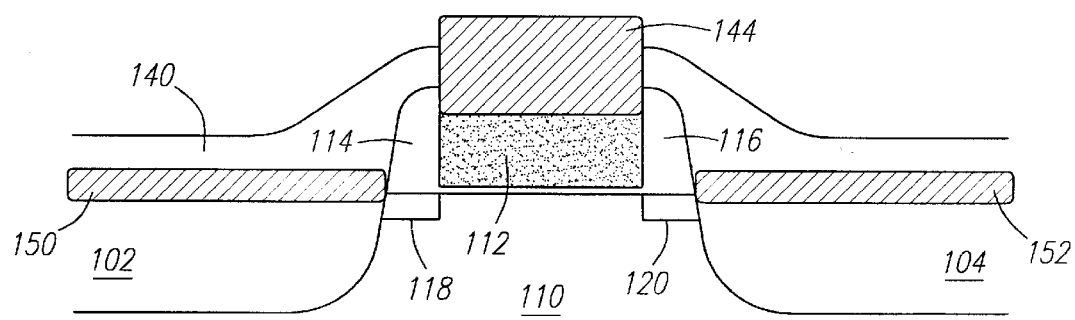
FIG. 7 illustrates the device of FIG. 1 at an alternative fourth phase of development.

FIG. 7 illustrates the device 100 of FIG. 1 at an alternative fourth phase of development. After the first thermal anneal shown in FIG. 6, a second thermal anneal is performed. The second anneal may range in temperature, for example, from about 600 degrees C. to about 1000 degrees C. The second anneal (1) promotes the reduction of the screening oxide layers 106, 108 over the source and drain areas 102, 104 by the capping layer material, such as titanium, (2) at least partially reacts the metal layer 140 over the source and drain areas 102, 104, and (3) drives the silicide formation 144 to completion over the gate area 112.

The method described above improves transistor speed by lowering the leakage current in the source and drain areas 102, 104 and lowering the polysilicon sheet resistance of the gate area 112.

The above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention.

What is claimed is:

1. A method of forming a silicide, the method comprising:
   forming a metal layer over a gate area, a first oxide layer and a second oxide layer, wherein the first oxide layer covers a source area and the second oxide layer covers a drain area;
   forming a capping layer over the metal layer, the capping layer comprising a material that can reduce an oxide;
   applying a first thermal anneal that causes the metal layer to at least partially react with the gate area to form a first silicide layer over the gate area;
   applying a second thermal anneal, wherein the second thermal anneal causes (1) the metal layer to further react with the gate area, (2) the material of the capping layer to diffuse through the metal layer and reduce the first and second oxide layers, and (3) the metal layer to at least partially react with the source and drain areas to form second and third silicide layers; and
   removing unreacted portions of the metal layer.

2. The method of claim 1, wherein the first silicide layer is about two to about three times thicker than the second and third silicide layers.

3. The method of claim 1, wherein the second thermal anneal causes substantially all of the metal layer over the gate area to react with the gate area.

4. The method of claim 1, wherein a temperature of the first thermal anneal is below a temperature that causes material of the capping layer to diffuse through the metal layer and reduce the first and second oxide layers.

5. The method of claim 1, wherein the metal layer is selected from the group consisting of Co, Ti, W, Ni and Mo.

6. The method of claim 1, wherein the capping layer is selected from the group consisting of Ti, Al, Li, Mg and Ca.

7. The method of claim 1, wherein the first thermal anneal ranges in temperature from about 300 degrees C. to about 600 degrees C.

8. The method of claim 1, wherein the first thermal anneal causes about 50% to about 90% of the metal layer over the gate area to react with the gate area, while the metal layer over the first and second oxide layers remains substantially unreacted.

9. The method of claim 1, further comprising selecting a thickness of the first and second oxide layers such that (1) the first thermal anneal does not cause a substantial silicide formation over the source and drain areas, and (2) the second thermal anneal causes a silicide formation over the source and drain areas.

10. The method of claim 1, wherein the second thermal anneal ranges in temperature from about 600 degrees C. to about 1000 degrees C.

11. The method of claim 1, further comprising controlling a thickness of the first silicide layer over the gate area by controlling a thickness of the metal layer.

12. The method of claim 1, further comprising controlling a thickness of the first silicide layer over the gate area by controlling the temperature of the first and second thermal anneals.

13. The method of claim 1, further comprising controlling a thickness of the second and third silicide layers by controlling a thickness of the metal layer.

14. The method of claim 1, further comprising controlling a thickness of the second and third silicide layers by controlling the temperature of the first and second thermal anneals.

15. The method of claim 1, wherein the act of applying the first thermal anneal is performed before the act of forming a capping layer over the metal layer.

16. The method of claim 1, further comprising the acts of:

forming a gate oxide layer on a substrate;

depositing a polysilicon layer over the gate oxide layer;

forming a mask layer over the polysilicon;

etching the polysilicon to form the gate area;

depositing and etching a first spacer on a first side of the gate area and a second spacer on a second side of the gate area, wherein the depositing and etching of the first and second spacers promote a high etch selectivity between the mask layer covering the gate area and the spacers;

forming the first oxide layer over the source area and the second oxide layer over the drain area; and selectively stripping away the mask layer to leave the first and second oxide layers over the source and drain areas undisturbed.

* * * * *